US008637856B2

(12) United States Patent
Ratier et al.

(10) Patent No.: US 8,637,856 B2
(45) Date of Patent: Jan. 28, 2014

(54) ELECTRONIC COMPONENTS WITH INTEGRATED ENCAPSULATION

(75) Inventors: Bernard Ratier, Verneuil-sur-Vienne (FR); Jean-Michel Nunzi, Bastelica (FR); André Moliton, Verneuil-sur-Vienne (FR); Mohamad Chakaroun, Roumine (LB)

(73) Assignee: Centre National de la Recherche Scientifique—CNRS, Paris Cedex (FR)

( * ) Notice: Subject to any disclaimer, the term of this patent is extended or adjusted under 35 U.S.C. 154(b) by 173 days.

(21) Appl. No.: 13/055,916

(22) PCT Filed: Jul. 22, 2009

(86) PCT No.: PCT/FR2009/000911
§ 371 (c)(1),
(2), (4) Date: Aug. 15, 2011

(87) PCT Pub. No.: WO2010/010254
PCT Pub. Date: Jan. 28, 2010

(65) Prior Publication Data
US 2012/0104365 A1    May 3, 2012

(30) Foreign Application Priority Data
Jul. 25, 2008   (FR) ...................................... 08 55122

(51) Int. Cl.
*H01L 29/08* (2006.01)
(52) U.S. Cl.
USPC ..................................... 257/40; 257/E51.012
(58) Field of Classification Search
USPC .................... 257/40, 103, 749, 773, E51.012, 257/E51.019; 313/498
See application file for complete search history.

(56) References Cited

U.S. PATENT DOCUMENTS

| 4,798,467 | A | 1/1989 | Wyeth et al. |
| 5,629,389 | A | 5/1997 | Roitman et al. |
| 5,872,355 | A | 2/1999 | Hueschen |
| 8,026,513 | B2 * | 9/2011 | Furukawa et al. ............... 257/40 |
| 8,058,093 | B2 * | 11/2011 | Wadell et al. ................... 438/82 |
| 2004/0232831 | A1 | 11/2004 | Chen |
| 2004/0245937 | A1 | 12/2004 | Hayashi et al. |
| 2006/0232781 | A1 | 10/2006 | Kranz et al. |
| 2007/0242275 | A1 | 10/2007 | Spartz et al. |

FOREIGN PATENT DOCUMENTS

| EP | 0777280 | 6/1997 |
| JP | 2003115393 | 4/2003 |
| JP | 2003187967 | 7/2003 |
| JP | 2003217854 | 7/2003 |
| WO | 9959024 | 11/1999 |
| WO | 2007025188 | 3/2007 |

OTHER PUBLICATIONS

International Search Report for International Application No. PCT/FR2009/000911, European Patent Office, Jan. 5, 2010, pp. 6.

(Continued)

*Primary Examiner* — Mark Prenty
(74) *Attorney, Agent, or Firm* — Bryan A. Santarelli; Graybeal Jackson LLP

(57) ABSTRACT

An embodiment relates to an electronic component that may consist of an organic LED or organic solar cell, that comprises at least one substrate, one active layer provided between a first and a second electrode and having an active layer protected from dioxygen and the water vapor of the air by the second electrode that encapsulates the active layer.

16 Claims, 4 Drawing Sheets

(56) References Cited

OTHER PUBLICATIONS

Christoph Lungenschmied, Gilles Dennler, Helmut Neugebauer, Serdar N. Sariciftci, Markus Glatthaar, Toby Meyer, Andreas Meyer, "Flexible, long-lived, large-area, organic solar cells", Solar Energy Materials & Solar Cells 91 (2007) 379-384, Nov. 2006.

* cited by examiner

ELECTRONIC COMPONENTS WITH INTEGRATED ENCAPSULATION

PRIORITY CLAIM

The present application is a national phase application filed pursuant to 35 USC §371 of International Patent Application Serial No. PCT/FR2009/000911, filed Jul. 22, 2009; which further claims the benefit of French Patent Application FR08/55122, filed Jul. 25, 2008; all of the foregoing applications are incorporated herein by reference in their entireties.

TECHNICAL FIELD

An embodiment relates to an electronic component including means for encapsulating the active layer integrated in the component. The electronic component is, for example, a thin layered organic one or one the active layer of which is composed of any other material having air resistance problems. An embodiment also relates to a method making it possible to produce such a component.

BACKGROUND

Organic electronic components are currently always more widely used because they offer numerous advantages as regards costs in terms of production, output and flexibility. Among the organic electronic components we can find organic LEDs and organic solar cells.

Document U.S. Pat. No. 5,629,389, which is incorporated herein by reference, describes an organic electroluminescent diode including a substrate, an electroluminescent organic layer which is inserted between a lower electrode in contact with the substrate and an upper electrode, and which is able to emit radiation through at least one of the electrodes when current is injected through the active layer by such electrodes. However, the scattering into the organic layer of some elements existing in the air, such as dioxygen or water vapor, results in the deterioration of the active layer which limits the service life of the diode.

In order to remedy such a problem, systems for encapsulating organic electronic components have been developed. Then, U.S. Pat. No. 5,872,355, which is incorporated herein by reference, describes the utilization of a polymer barrier seal of the Saran type placed around the electroluminescent diode and making it possible to reduce the attacks of the active layer by dioxygen, the water vapor or the other elements existing in the air. However, the water vapor permeability rate requested to guarantee a sufficient service life of the organic diode is approximately equal to $10^{-6}$ g m$^{-2}$ per day$^{-1}$ atm$^{-1}$. Now, the best polymer films have water vapor permeability which is approximately 5 times this rate. Such encapsulation systems are thus not sufficient to guarantee a satisfactory service life of the organic components.

Other encapsulation systems have been developed. Thus, the article published by Christoph Lungenschmied, Gilles Dennler, Helmut Neugebauer, Serdar N. Sariciftci, Markus Glatthaar, Toby Meyer, Andreas Meyer and entitled "Flexible, long-lived, large-area, organic solar cells" and published in Solar Energy Materials & Solar Cells 91 (2007) 379-384, and which is incorporated herein by reference, describes an organic/inorganic multilayer composed of PET(SiOx/PEN)*5 which encapsulates an organic diode so as to protect it against environmental attacks. However, the multiplication of layers reduces the flexibility of the diode and increases the manufacturing cost of the component.

In addition, in the case of other organic electronic components, such as organic solar cells, this protection is not sufficient.

SUMMARY

An embodiment remedies the drawbacks of the state of the art by providing the encapsulation of the active layer through the coating of the active layer by the upper electrode to the substrate. Then, the protection of the active layer provided by one of the two electrodes is directly integrated in the substrate.

More precisely, according to a first embodiment, an electronic component includes a substrate, an active layer inserted between a first and a second electrode, with the first electrode being placed on the substrate, wherein:
  the active layer covers the first electrode by forming an envelope which isolates the first electrode from the second electrode, and
  the second electrode covers the active layer to form with the substrate a protective capsule around an assembly formed by the first electrode and the active layer.

The first electrode may include a charge routing finger which comes out of the protective capsule through a hole provided through the active layer and the second electrode.

The active layer may include a protrusion which covers the charge routing finger and which comes out of the capsule formed by the second electrode.

The active layer may be an organic semiconductor which is liable either to emit a radiation through at least one of the two electrodes when a current is injected therein, or to produce a current when a radiation goes therethrough. In the first case, the electronic component is an electroluminescent diode, whereas in the second case the component is an organic solar cell. In both cases, the organic electronic component may be flexible.

The substrate may be a visible light safe plane plate, for example a plate made of glass or plastic.

The first electrode may be an anode, i.e. in the case of a solar cell (respectively an electroluminescent diode) it collects (respectively injects) positive charges and is transparent for wavelengths absorbed (respectively emitted) by the device. The active layer which absorbs (respectively emits) a radiation in addition provides the transportation of photogenerated (respectively injected) charges. The second electrode is a cathode which collects (respectively injects) negative charges. It is also used as an optical mirror for the radiation injected (respectively emitted) by the device in the case of both devices, to increase the optical path of light through the absorbing organic layer (solar cell) or for recovering the part of light (emitted by the active layer in an isotropic way) in the half-space oriented towards the cathode.

In the electronic component according to an embodiment, the second electrode encapsulates the active layer which makes it possible to limit the surface of the active layer in contact with the open air. As a matter of fact, the active layer includes a lower face which is placed against the first electrode, an upper face which is covered with the second electrode and side walls also covered with the second electrode. The lower face of the active layer is protected by the first electrode and the substrate, the upper face of the active layer is protected by the second electrode. In addition, the second electrode also covers the side walls of the active layer in order to prevent air from entering the active layer through the side walls thereof. Consequently, the second electrode covers the upper face of the active layer as well as the side walls thereof so that it forms, with the substrate, a protective capsule which slows down the penetration of air into the active layer.

In addition, in order to avoid any risk of short-circuit between the two electrodes, the active layer may be totally inserted between the first and the second electrode, i.e. there is no place in the component wherein the first electrode faces the second electrode having no active layer between the two electrodes. The first electrode thus includes a lower face in contact with the substrate, an upper face and the side walls, with the upper face and the side walls being covered with the active layer. Consequently, the first electrode is surrounded by the active layer and the substrate, whereas the assembly formed by the first electrode and the active layer is encapsulated by the second electrode and the substrate. The active layer thus has a larger surface than the first electrode, so that it can cover it.

In addition, in order to enable the connection of the electrodes to an electric circuit, it may be necessary to provide for a link between the first electrode, which is covered with the active layer, and the outside of the protective capsule. The first electrode therefor includes a charge routing finger which comes out of the protective capsule through a hole provided through the active layer and the second electrode.

Advantageously, the charge routing finger may include a free end located outside the capsule, and it may also be covered with the active layer, except for the end thereof which is in the open air. The free end of the first electrode may thus be connected to an electric circuit which makes it possible to route the charges from or towards the first electrode in spite of the presence of the protective capsule and of the active layer around the first electrode.

The active layer may include a protrusion which covers the charge routing finger and which comes out of the capsule formed by the second electrode.

This protrusion is in fact an appendix of the active layer which comes out through the hole provided in the protective capsule and which covers the upper face and the side walls of the charge routing finger. On the contrary, such a protrusion does not cover the end of the charge routing finger to enable the link between the charge routing finger and an electric circuit. The presence of the protrusion of the active layer on the charge routing finger makes it possible to avoid any risk of short-circuit between the routing finger and the second electrode, more particularly in the hole area.

Then, in an electronic component according to an embodiment, the active layer is totally protected by the second electrode, except for the protrusion of the active layer which covers the routing finger of the first electrode. This arrangement makes it possible to limit as much as possible the surface of the active layer in direct contact with the open air while avoiding any risk of short-circuits in the component.

Then, the system protecting the active layer makes it possible to limit the contacts of the active layer with the open air, without adding additional protective layers and thus without adding additional production steps during the manufacturing of the component and without adding additional materials.

In the following, the abbreviation "ITO" refers to a tin doped indium oxide (or "Indium tin oxide") and the adjective "longitudinal" refers to a plane parallel to the upper face of the substrate.

According to the various embodiments:
the second electrode totally covers the substrate and the active layer, except for the protrusion which covers the charge routing finger;
the active layer has a greater surface than the first electrode in order to avoid any risk of short-circuit;
the first electrode includes an active part inserted in the protected capsule with the active part having a substantially rectangular longitudinal section;
the charge routing finger has a substantially rectangular longitudinal section;
the first electrode has a substantially triangular longitudinal section with the charge routing finger being composed of a portion of the triangle located close to one of the apexes of the triangle. Such an arrangement makes it possible to reduce the series resistance of the electronic component;
the substrate is transparent to visible waves;
the first electrode is a transparent conductive oxide;
the substrate is at least partially covered with a chromium and gold pre-metallization. This pre-metallization makes it possible to reduce the series resistance of the electronic component;
the charge routing finger includes chromium and gold. In this case, the first electrode is composed of the active part which is provided in a transparent conductive oxide, most often an ITO and a charge routing finger, which is composed of chromium and gold. The high conductivity of such a chromium and gold metallization makes it possible to minimize the dissipative losses resulting from the small dimensions of the charge routing finger;
the first electrode is composed of a multilayer of ITO/metal/ITO which also makes it possible to minimize the dissipative losses resulting from the small dimensions of the charge routing finger;
in the case where the electronic component is an organic electroluminescent diode, the active layer is an organic semiconductor which may be formed of one of several elements selected from the following group: a molecular conjugated organic material of the oligomer type, an organometallic complex, a conjugated polymer or an organometallic complex of a rare earth organometallic complex inserted into a conjugated polymer matrix, with such materials having electroluminescent properties or functionalities such as hole or electron conductor or hole or electron lock.
in the case where the electronic component is an organic solar cell, the active layer is an organic semiconductor which may be composed of one or several elements selected from the following group: a couple of conjugated organic materials, one of which is an electron donor, either in the form of small molecules or oligomers, or in the form of polymers, with respect to the other which is an electron acceptor in the form of a conjugated molecule material. This couple of materials is placed either successively, i.e. the electron donor is deposited, then the iron acceptor is deposited or they are both deposited at the same time when they are mixed together.
the second electrode is composed of one or several metal(s) with one of such metals possibly being aluminium;
the electronic component further includes at least an air tight protection layer which covers the second electrode and the active layer; as a matter of fact, this system protecting the active layer by the second electrode may of course be combined with already known protective systems: more particularly, the obtained electronic component may then be covered with a protection multilayer similar to the ones already known, for example thanks to document EP 0 777 280, which is incorporated herein by reference. In this case, the additional protective layer completely covers the electronic component: it thus covers the second electrode, the active layer and the protrusion thereof. The system protecting a component according to an embodiment, coupled with the protective systems of the prior art thus makes it possible to significantly increase the service life of the organic components;

the electronic component composes an organic solar cell or an organic electroluminescent diode.

An embodiment according to which the first electrode has a substantially triangular longitudinal section, with the charge routing finger being composed of a portion of a triangle located close to one of the apexes of the triangle may be particularly advantageous. As a matter of fact, one of the weak points entailed in the existence of a charge routing finger is the increase in the series resistance of the component, which results in a loss in the shape factor which amounts to 0.53 in the components of the prior art and only to 0.43 for the components according to an embodiment, which have a substantially rectangular longitudinal section. On the contrary, in components according to an embodiment which have a first electrode with a substantially triangular longitudinal section, the shape factor is greater and it is also better than in the components of the prior art which had no charge routing finger.

This embodiment further makes it possible to reduce the local resistive dissipative losses and to increase the output of the component since the series resistance thereof is reduced.

In an embodiment in which the first electrode has a substantially rectangular longitudinal section, the charge routing finger is composed of a portion of a triangle located close to one of the apexes of the triangle and consequently the connection of the charges occurs at one of the apexes of the triangle.

This embodiment with a triangular geometry may be particularly well-adapted when the electronic component includes a transparent conductive oxide. More particularly, this geometry may be particularly suitable for small organic molecules-based solar cells, the active layer of which is composed of CuPc-C60 by "PVD" or plasma vapour deposition. This geometry may also be well-suited for electronic components, the active layer of which is produced by spin coating with P3HT-PCBM. The triangular geometry may be used in any type of solar cell with a thin layer of a transparent conductive oxide.

A second embodiment relates to one embodiment of an electronic component including a substrate, an active layer inserted between the first and the second electrode, with the first electrode being deposited on the substrate, characterised in that it includes the step of depositing the second electrode, so that an assembly formed by the first electrode and the active layer is encapsulated between the second electrode and the substrate.

The method may further include a step of producing the first electrode on the substrate and a step of producing the active layer on the first electrode.

According to various embodiments:
the step of producing the first electrode is carried out by etching the first electrode or vacuum depositing the first electrode through a mask;
the step of producing the active layer is carried out by one of the following methods:
in the case where the active layer is a molecular organic compound, the step of producing the active layer is carried out by a vacuum sublimation through a mask;
in the case where the active layer is a polymer or a mixture of polymer and organic molecules, the step of producing the active layer is carried by centrifuging followed by a step of etching;
in the case where the active layer is ink, the step of producing the active layer is carried out by silkscreen printing, flexographic printing or ink jet direct printing.
the method may further include a step of pre-metallization of the substrate prior to the step of depositing the first electrode.

BRIEF DESCRIPTION OF THE DRAWINGS

Characteristics and advantages of one or more embodiments will become apparent when reading the following description and referring to the appended drawings which illustrate:

FIG. 9, the current density in the anode of the solar cell in FIG. 8a;

For more clarity, identical or similar elements have identical reference signs on all the figures.

DETAILED DESCRIPTION

Figure 1:
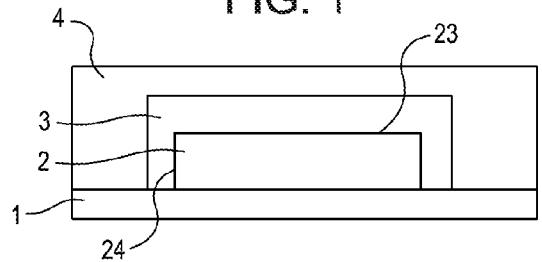
FIG. 1, a cross-sectional view of an organic solar cell according to an embodiment.

FIG. 1 shows an organic solar cell according to an embodiment. This solar cell includes a substrate 1 made of a transparent flexible plastic, a first electrode which constitutes an anode 2 made of transparent oxide, an active layer 3 made of an organic semiconductor and a second electrode which constitutes a cathode 4 made of aluminium.

The organic solar cell operates as follows: light penetrates through the anode and is then absorbed by the active layer. The thus absorbed photons create electron/hole pairs which are separated and routed towards the electrodes.

Figure 3:
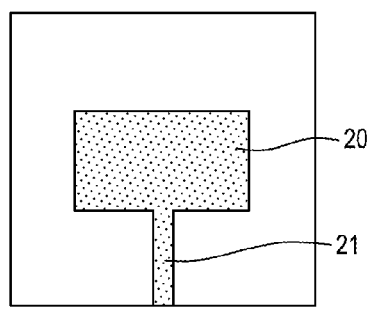
FIGS. 3, 4, 5, top views of the solar cell of FIG. 1 during each step of a production method thereof.
Figure 4:
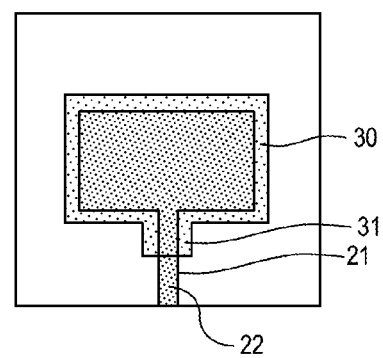
Figure 5:
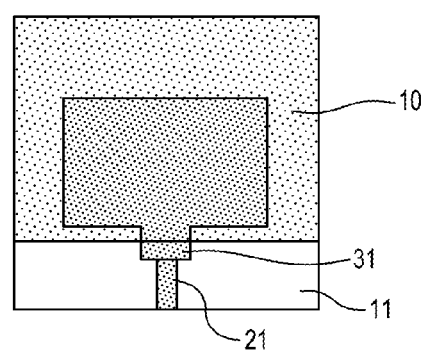

The steps of production of the solar cells are shown in FIGS. 3-5.

The first step, shown in FIG. 3, consists in producing the anode on the substrate. The anode includes a rectangular active part 20 and a charge routing finger 21 which enables the extraction of charges from the active part 20 towards an electric circuit. The anode is approximately 100 nm thick.

The anode is made of an ITO (Indium Tin Oxide) which may be deposited on the substrate and then etched to obtain the desired shape for the anode, or else it may be vacuum deposited by magnetron spraying or ionic spraying through a mask, making it possible to restore the shape of the anode. Part 1 delimits the active layer of the solar cell.

The second step, shown in FIG. 4, consists in producing the active layer 3 (FIG. 1) on the anode 2 (FIG. 1). The active layer 3 completely covers the anode except for the free end 22 of the routing finger 21. Consequently, the active layer 3 completely covers the upper face 23 (FIG. 1) of the anode as well as the side walls 24 (FIG. 1) thereof. The active layer thus forms an isolating envelope 3 (FIG. 1) on the anode 2, as shown in FIG. 1.

The organic active layer is produced by vacuum sublimation if it is an organic molecule-based active layer, through a small stencil mask delimiting the geometry of this layer. If the active layer is produced wet, a step of etching may be required a posteriori to obtain the desired geometry. The part 30 of this layer may need to have a larger surface than the part 20 (FIG. 3) of the transparent conductive oxide in order to avoid the risks of short-circuit between the anode and the cathode of the device. For the same reason, the organic layer 3 (FIG. 1) may need to have a protrusion 31 which will go beyond the edge of the following metallization and which covers the charge routing finger 21, except for the end thereof 22. If the active layer is produced wet, a step of etching may be required a posteriori to obtain the desired geometry, except in the case of the ink jet technology where the geometry of the active layer is obtained by direct writing.

The third step, shown in FIG. 5, consists in producing the cathode 4 (FIG. 1). The cathode covers the whole substrate 10, except for the lower part 11 thereof, so that the end of the protrusion 31 is not covered, so as to avoid any risk of short-circuit between the anode and the cathode. The anode/active layer assembly is thus totally encapsulated between the cathode and the substrate, except for the routing finger 21 and the end of the protrusion 31, which makes it possible to limit the sputtering of oxygen and water vapor into the active layer. As a matter of fact, access to the active layer is blocked by the cathode. The only place of the active layer which is not protected by the cathode is the protrusion 31. The protrusion 31 represents a very small surface with respect to the whole surface of the active layer and consequently most of the active surface is protected by the cathode. In addition, encapsulation multilayers may then be deposited on the whole component. Such multilayers make it possible to reinforce the protection of the active layer at places where the active layer is covered with the cathode and it makes it possible to protect the protrusion 31.

Figure 2:
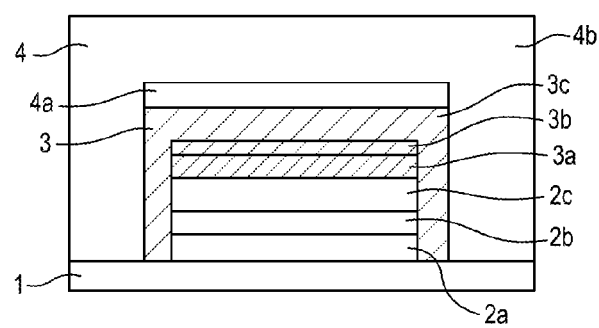
FIG. 2, a cross-sectional view of an organic solar cell according to another embodiment.
Figure 6:
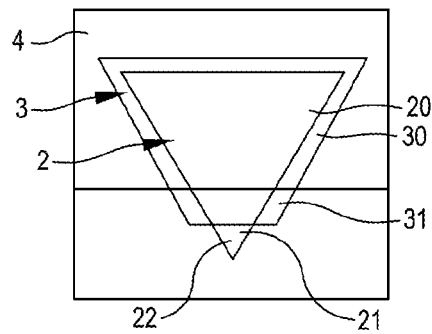
FIG. 6, a top view of an organic solar cell according to another embodiment.
Figure 7:
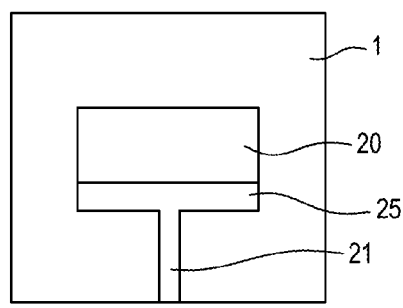
FIG. 7, a top view of the anode of a solar cell according to another embodiment.

Improvements of such an embodiment are shown in FIGS. 2, 6 and 7. As a matter of fact, a weak point of such an embodiment may be the small dimension of the charge routing finger 21, which may significantly increase the series resistance of the solar cell. The following three embodiments may make it possible to make up for the small dimensions of the charge routing finger 21, while having a minimum surface for the charge routing finger and thus of the protrusion 31 which is exposed to the air.

The first embodiment, shown in FIG. 7, consists in producing, in a chromium+gold mixture, a pre-metallization which constitutes the charge routing finger 21 as well as a transitory part 25 making it possible to provide a link between the charge routing finger and the active part of the anode 20. The high conductivity of the pre-metallization makes it possible to minimize the dissipative loss resulting from the small dimensions of the routing finger 21. The production of the anode with a transparent conductive oxide may then be summed up to the production of the active part 20 and it is produced further to the chromium+gold metallization.

Another embodiment is shown in FIG. 2. It consists in providing the anode in a transparent conductive oxide with very high conductivity. Therefore, the anode may be composed of three layers 2a, 2b, and 2c, as shown in FIG. 2. The first layer 2a is made of ITO, the second layer 2b is made of metal, wherein the metal is gold, metal or silver and the third layer 2c is also made of ITO. ITO layers 2a and 2b have a thickness of the order of 30 to 50 nm and the metallic layer 2b has a thickness of the order of 10 nanometers (nm). The production of such layers is obtained by spraying in the same deposition bench, using the same mask of the screen type. The very high conductivity of the anode 2 makes it possible to reduce the series resistance of the solar cell in spite of the small dimensions of the charge routing FIG. 21.

The active layer may also be composed of several layers 3a, 3b, 3c, which do not necessarily cover the whole of the anode. On the contrary, at least one of these layers, layer 3c here, may completely surround the anode. The cathode may also be composed of several layers 4a and 4b, at least one of which totally encapsulates the active layer, except for the appendix 31.

A third embodiment is shown in FIG. 6. It consists in producing the anode 20 with the shape of a triangle. The active part 20 is then composed of most of the surface of the triangle except for the surface located close to one of the apexes, which forms the charge routing finger 21. The shape of the anode 2 makes it possible to reduce the series resistance of the solar cell. The active layer 3 may match the shape of the anode 2 and may cover it totally, except for the end 22 of the charge routing finger. The cathode has any shape, so far as it totally encapsulates the active layer, except for the appendix 31, which makes it possible to avoid short-circuits.

In the embodiment shown in FIG. 6, the charge routing finger is located in one of the apexes of the triangle formed by the anode. The collection of the positive charges then may occur in one of the apexes of the triangle and not on one of the sides of the triangle, which offers the significant advantage of limiting the surface of the appendix 31 which is exposed to the open air. As a matter of fact, a much smaller surface of the appendix 31 may be necessary to cover a part of the charge routing finger in one of the apexes than is necessary to cover a part of the charge routing finger located in one of the sides of the triangle.

Figure 13A:
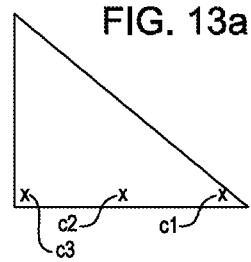
FIG. 13a, an anode of a solar cell according to an embodiment, whereon three contact points are successively selected.
Figure 13B:
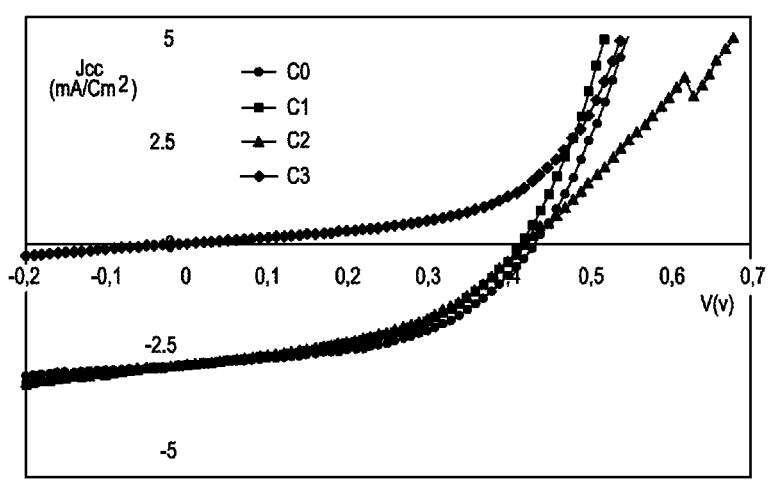
FIG. 13b, the current density vs. voltage in the solar cell of FIG. 13a for each one of the selected contact points.

FIGS. 13a and 13b further show that collecting the positive charges in one of the apexes of the triangle is possible. As a matter of fact, FIG. 13a shows a solar cell anode 2 made of ITO. For clarity, only the anode 2 is shown. Such an anode 2 has the shape of a right angled triangle. Such an anode is covered with an active layer and a cathode which are not shown in FIG. 13a. The active layer and the cathode totally cover the anode 2, except for three points c1, c2, c3, which are used in turn as a charge routing finger. The active layer is inserted in every point between the anode and the cathode.

FIG. 13b shows the current density vs. voltage in the solar cell which includes the anode of FIG. 13a. Characteristic C0 shows the current density vs. voltage in the solar cell when the latter is in the dark. Characteristics C1, C2, C3 show the current density vs. voltage in the cell when the latter is exposed to 100 mW/cm$^2$ lighting. More precisely, characteristic C1, respectively C2 and C3, show the current density vs. voltage in the solar cell when the charge routing finger is located at c1, respectively c2, c3. Then, characteristics C1, C2, C3 each correspond to contact points at three different locations of anode 2 for collecting the positive charges, with characteristic C1 corresponding to a contact at contact point c1, characteristic C2 corresponding to a contact at contact point c2 and characteristic C3 corresponding to a contact at contact point c3.

Characteristics C1, C2 and C3 are relatively similar although the current density is extremely different. This shows that collecting the charges at one of the apexes of the triangle is possible without any problem, and thus minimizing the part of the active layer exposed to the open air is possible, too. Consequently, when the anode has a triangular geometry, it is desirable to position the charge routing finger in one of the apexes of the triangle and not the sides of the triangle. However, the contact may occur on the side where the current density is the highest, i.e. in position c3, as shown by the photovoltaic parameters in the table hereinunder. Then, in a right angled triangle, the contact may occur on the 90° angle side, i.e. the charge routing finger is located in the 90° angle of the right angled triangle.

The table hereinunder sums up the results obtained while collecting the positive charges at each one of points c1, c2, and c3.

| Charge collection points | Output (%) | Shape factor | Voc (V) | Icc (mA) | Rs (Ω) | Rch (Ω) |
|---|---|---|---|---|---|---|
| c1 | 0.61 | 0.45 | 0.42 | 0.75 | 67 | 1,538 |
| c2 | 0.56 | 0.43 | 0.43 | 0.728 | 196 | 1,492 |
| c3 | 0.66 | 0.49 | 0.44 | 0.741 | 79 | 2,500 |

An embodiment, wherein the anode has a longitudinal section with the shape of a triangle may be a preferred embodiment.

In order to compare the results of the various geometrical shapes, solar cells according to an embodiment have been produced. All the solar cells include a substrate 1, whereon an ITO anode 2, an active layer 3 composed of:
  a PEDOT-PSS (Poly(3, 4-ethylenedioxithiophene) poly (styrenesulfonate)) layer;
  a CuPc (copper phthalocyanine) layer;
  a C60 (fullerene) layer;
  a BCP layer
are deposited.

Finally, such solar cells include a cathode 4 made up of aluminium. A cross-sectional view of such solar cells is similar to the cross-sectional view of FIG. 1.

Figure 8A:
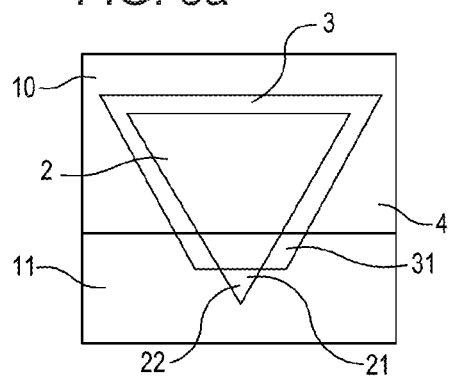
FIG. 8a, a top view of an organic solar cell according to an embodiment wherein the solar cell includes an anode having a longitudinal section with the shape of an isosceles triangle.
Figure 8B:
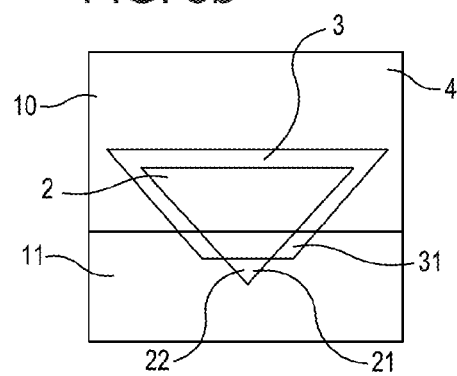
FIG. 8b, a top view of an organic solar cell according to an embodiment wherein the solar cell includes an anode having a longitudinal section with the shape of a right angled triangle.
Figure 8C:
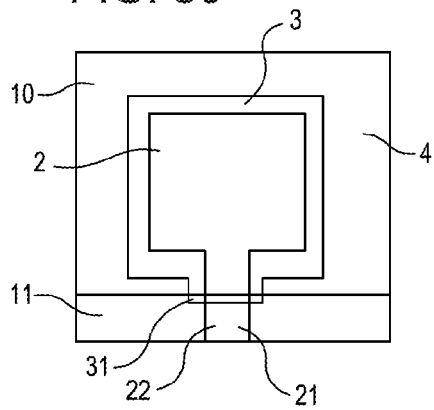
FIG. 8c, a top view of an organic solar cell according to an embodiment wherein the solar cell includes an anode having a longitudinal section with a square shape.

Top views of such solar cells are shown in FIGS. 8a, 8b and 8c respectively.

The solar cell of FIG. 8a includes an anode 2 having the shape of an isosceles triangle with the collection of charges occurring thanks to the charge routing finger 21, which is located in one of the apexes of the isosceles triangle. The active layer 3 has the shape of a trapezium which covers the whole anode 2, except for the end 22 of the charge routing finger 21.

The solar cell of FIG. 8b includes an anode 2 having the shape of a right angled triangle, with the collection of charges occurring thanks to the charges routing finger 21 which is located in the apex of such a right angled triangle, which has a 90° angle. The active layer 3 has the shape of a trapezium which covers the whole of the anode 2 except for the end 22 of the charge routing finger 21.

The solar cell of FIG. 8a includes an anode 2 having the shape of a square, with the collection of charges occurring thanks to a charge routing finger 21 having the shape of a rectangle. The active layer 3 has the shape of a square which covers the whole of the anode 2, except for the end 22 of the charge routing finger 21.

In the three cases, the cathode 4 covers the whole substrate 10, except for the lower part 11 thereof, so that the protrusion 31 is not covered with the cathode 4, in order to avoid any risk of short-circuit between the anode 2 and the cathode 4. The anode/active layer assembly is then totally encapsulated between the cathode and the substrate 1, except for the charge routing finger 21 and the end of the protrusion 31, which makes it possible to limit the sputtering of dioxygen and water vapor into the active layer.

In the three embodiments of FIGS. 8a, 8b and 8c, the active layers have the same surface in a longitudinal plane with such a surface being equal to 25 mm$^2$.

Simulations have been carried out to compare the results obtained with the three embodiments shown in FIGS. 8a, 8b and 8c, which have the same chemical composition but different geometry.

In all cases, the solar cells show a large surface of active layer, i.e. a surface of more than 10 cm$^2$, as compared to the thickness of the anode or the cathode. As a matter of fact, in the three embodiments of FIGS. 8a to 8c, the surface of the active layer is equal to approximately 10$^4$ times the cross-sectional section of the anode or the cathode. Now, as the current flow in the electrode, which is also the flow of photo-generated current in the active layer, is conservative, a large part of the energy generated by a photovoltaic effect is dissipated because of the Joule effect at the anode 2, because of the high resistance thereof. The resistive heating is also a cause for an unduly ageing of the solar cells.

Figure 9:
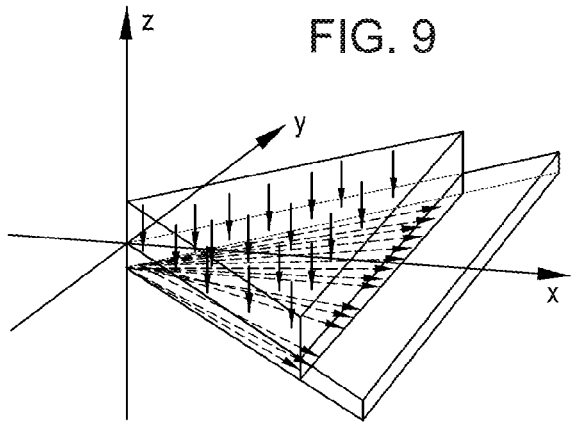

Now, in the case of a triangular geometry, it can be noted that the increase in the current density, when getting close to the charge collection point, in the end 22, is compensated by the increase in the section of the anode. The current density in the triangular anode of FIG. 8a is shown in FIG. 9.

Figure 10:
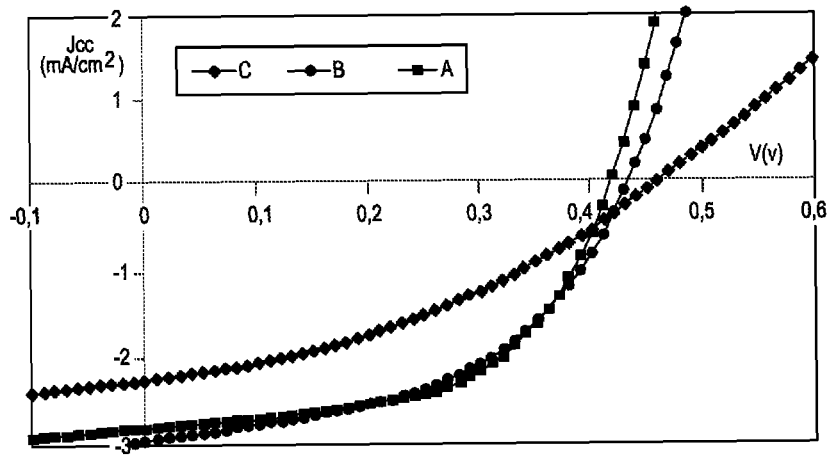
FIG. 10, a curve showing the current density vs. voltage in the solar cells in FIGS. 8a, 8b and 8c.

FIG. 10 shows the current density vs. voltage in the three solar cells of FIGS. 8a, 8b and 8c. Curve A shows the evolution of the current density vs. voltage in the solar cell having the geometry of an isosceles triangle shown in FIG. 8A. The curve B shows the evolution of the current density vs. voltage in the solar cell having the geometry of the right angled triangle shown in FIG. 8b. Curve C shows the evolution of current density vs. voltage in the solar cell having the geometry of the square shown in FIG. 8c. It clearly appears that the geometry which has the lowest series resistance is that of FIG. 8a, wherein the anode has the shape of an isosceles triangle. The solar cell which has an anode with the shape of a rectangular triangle has a series resistance which is slightly above that of FIG. 8a. Finally, the solar cell which has the highest series resistance is that of FIG. 8c, which has an anode with the shape of a square. The results obtained for the three solar cells are summed up in the table hereinunder:

| Solar cell | Power loss (nW) | Output (%) | Shape factor | Series resistance (Ω) | Parallel resistance (Ω) |
|---|---|---|---|---|---|
| Square anode | 4.19 | 0.413 | 0.37 | 400 | 1,923 |
| Anode having the shape of a right angled triangle (FIG. 8b) | 2.85 | 0.66 | 0.487 | 79 | 2,500 |

-continued

| Solar cell | Power loss (nW) | Output (%) | Shape factor | Series resistance ($\Omega$) | Parallel resistance ($\Omega$) |
|---|---|---|---|---|---|
| Anode having the shape of an isosceles triangle (FIG. 8a) | 2.63 | 0.7 | 0.55 | 55 | 3,846 |

Then it can be noted that the dissipated power is much weaker in the solar cells having an anode with the shape of a triangle, whether an isosceles or a right angled triangle, than in the solar cells which have an anode in the shape of a square and consequently, the output and the shape factor are better in the solar cells having an anode with the shape of a triangle, whether an isosceles or a right angled triangle than in the solar cell which has an anode with the shape of a square. Finally, the series resistance is much smaller in the solar cell, having an anode with the shape of a triangle, whether an isosceles or right angled triangle than in the solar cell having an anode with the shape of a square.

Figure 11:
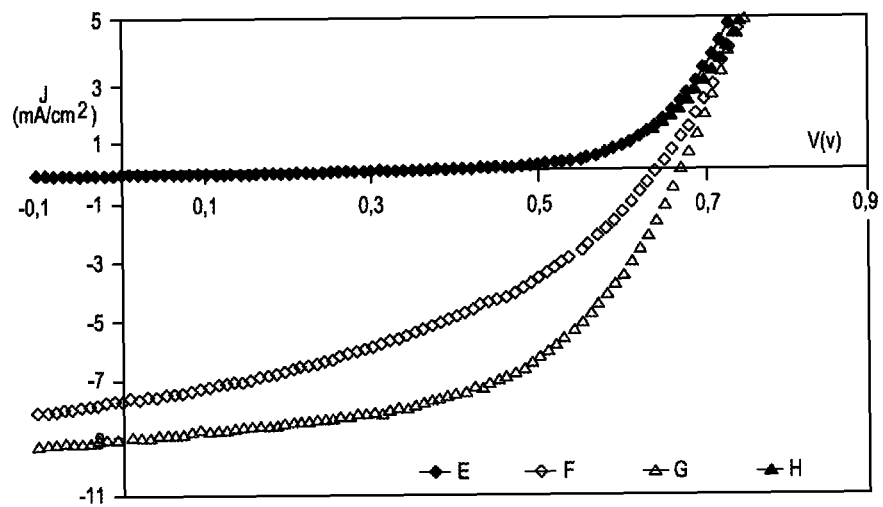
FIG. 11, the current density vs. voltage in the various solar cells which include an active layer made of P3HT-PCBM.

FIG. 11 shows, for an active layer made of P3HT-PCBM ((poly(3-hexylthiphene) and (phenyl-C61-butyric acid methyl ester)):
  in curve E, the current density vs. the voltage in a solar cell, the anode of which has the shape of a rectangle in the case where there is no light;
  in curve F, the current density vs. voltage in a solar cell, the anode of which has the shape of an isosceles triangle, in the case where there is no light;
  in curve G, the current density vs. voltage in a solar cell, the anode of which is in the shape of a rectangle with 100 mW/cm$^2$ lighting, in this case the output is equal to 2.09 and the shape factor is equal to 0.4;
  in curve H, the current density vs. voltage in a solar cell, the anode of which has the shape of an isosceles triangle, with 100 mW/cm$^2$ light, in this case the output is equal to 3.37 and the shape factor is equal to 0.53.

It can be seen that the current density is approximately three times higher in the case where the active layer is made of P3HT-PCBM and when the active layer is made of CuPc/C60. The improvement of photovoltaic characteristics by a triangular geometry limiting the dissipation in the electrodes is then more significant in a solar cell which includes a layer made of P3HT-PCBM than in a solar cell which includes a layer made of CuPc/C60.

Figure 12:
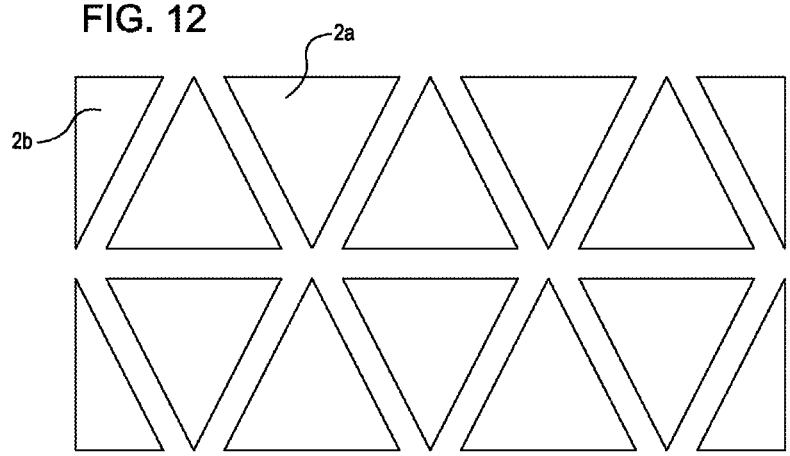
FIG. 12, an advantageous arrangement of several solar cells according to an embodiment.

FIG. 12 shows an advantageous association of several anodes in the shape of a triangle according to an embodiment. Solar cells having anodes with the shape of isosceles triangles are associated with the solar cells having anodes with the shape of a right angled triangle so that the anodes with the shape of isosceles triangles 2$a$ and those having the shape of right angled triangles 2$b$ form a rectangle. Such an arrangement makes it possible to gain space.

Of course, two or three of the above alternatives may be associated to reduce the series resistance of the solar cell while protecting the active layer. For example, an anode can be made with the shape of a triangle which is composed of an ITO/metal/ITO multilayer.

In addition, the solar cell thus built may also be protected by a conventional multilayer which increases the protection of the active layer against oxygen and water vapour.

An analog description might be made from an organic electroluminescent diode.

Of course, numerous alternatives are possible: for example, a same substrate may be used in several electronic components: the substrate may thus be a large plate whereon several first and second electrodes separated by an active layer are deposited.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electronic component including a substrate, an active layer inserted between a first and a second electrode, the first electrode being placed on the substrate, wherein:
  the active layer covers the first electrode thus forming an envelope which isolates the first electrode from the second electrode and
  the second electrode covers the active layer so as to form with the substrate a protective capsule around an assembly formed by the first electrode and the active layer,
  wherein the first electrode includes a charge routing finger which comes out of the protective capsule through a hole provided through the active layer and the second electrode,
  and wherein the active layer includes a protrusion which covers the charge routing finger and which comes out of the capsule formed by the second electrode.

2. An electronic component according to claim 1, wherein the second electrode totally covers the substrate and the active layer except for the protrusion which is in the open air.

3. An electronic component according to claim 1, wherein the active layer has a greater surface than the first electrode.

4. An electronic component according to claim 1, wherein the first electrode includes an active part included in the protective capsule, with such active part having a substantially rectangular longitudinal section.

5. An electronic component according to claim 1, wherein the charge routing finger has a substantially rectangular longitudinal section.

6. An electronic component according to claim 1, wherein the first electrode has a substantially triangular longitudinal section with the charge routing finger being composed of a portion of the triangle located close to one of the apexes of the triangle.

7. An electronic component according to claim 1, wherein the substrate is transparent to visible waves.

8. An electronic component according to claim 1, wherein the first electrode is a transparent conductive oxide.

9. An electronic component according to claim 1, wherein the substrate is at least partially covered with a chromium and gold pre-metallization.

10. An electronic component according to claim 1, wherein the charge routing finger includes chromium and gold.

11. An electronic component according to claim 1, wherein the first electrode is composed of an ITO/metal/ITO multilayer.

12. An electronic component according to claim 1, with the component being an organic electroluminescent diode, wherein the active layer is an organic semiconductor which is preferably composed of one or several elements selected from the following group: a molecular conjugated organic material of the oligomer type, an organometallic complex, a conjugated polymer and a rare earths organometallic complex inserted into a conjugated polymer matrix demonstrating electroluminescent properties or functionalities such as holes or electron conductor or holes or electron lock.

13. An electronic component according to claim 1, with the component being an organic solar cell, wherein the active layer is an organic semiconductor which is preferably composed of one or several elements selected from the following group: a couple of conjugated organic materials, one of which is an electron donor, either in the form of small molecules or oligomers or in the form of a conjugated polymer with respect to the other one which is an electron acceptor in the form of a molecular material.

14. An electronic component according to claim 1, wherein the second electrode is composed of one or several metals with one of these metals preferably being aluminium.

15. An electronic component according to claim 1, further including at least one airtight protective layer which covers the second electrode and the active layer.

16. An electronic component according to claim 1, wherein the component constitutes an organic solar cell or an organic electroluminescent diode.

* * * * *